United States Patent [19]

Flaxl

[11] Patent Number: 5,491,715
[45] Date of Patent: Feb. 13, 1996

[54] AUTOMATIC ANTENNA TUNING METHOD AND CIRCUIT

[75] Inventor: Thomas J. Flaxl, Train, Germany

[73] Assignee: Texas Instruments Deutschland GmbH, Germany

[21] Appl. No.: 83,810

[22] Filed: Jun. 28, 1993

[51] Int. Cl.$^6$ ................................................. H04L 27/06
[52] U.S. Cl. ................. 375/344; 375/304; 375/334; 375/373; 455/41; 455/107; 455/121; 455/123; 455/129; 455/193.1; 455/193.2; 333/17.3; 333/32
[58] Field of Search ................. 375/63, 88, 97, 375/118, 119; 455/107, 120, 121, 123, 125, 129, 41, 193.1, 193.2, 197.2, 197.3; 333/17.3, 32

[56] References Cited

U.S. PATENT DOCUMENTS

| | | | |
|---|---|---|---|
| 3,188,568 | 6/1965 | Monachesi | 375/63 |
| 4,201,960 | 5/1980 | Skutta et al. | 455/123 |
| 4,669,094 | 5/1987 | Van Rumpt | 375/88 |
| 5,040,239 | 8/1991 | Kondo et al. | 455/193 |
| 5,053,774 | 10/1991 | Schuermann et al. | 342/44 |
| 5,155,466 | 10/1992 | Go | 375/97 |
| 5,170,496 | 12/1992 | Viereck | 455/121 |

FOREIGN PATENT DOCUMENTS 55-125728  9/1980  Japan ................. 455/121

OTHER PUBLICATIONS

Ser. No. 07/981,635 Nov. 25, 1992 Meier.

*Primary Examiner*—Stephen Chin
*Assistant Examiner*—Amanda T. Le
*Attorney, Agent, or Firm*—Brian C. McCormack; James C. Kesterson; Richard L. Donaldson

[57] ABSTRACT

A method of matching the resonant frequency of an antenna resonant circuit (18, 46) to the output frequency of a transmitter output stage (26), the method includes the step of providing a powering signal from the transmitter output stage (26) to the antenna resonant circuit (18, 46). The method further includes the step of receiving at the antenna resonant circuit (18, 46) the powering signal, the antenna resonant circuit (18, 46) comprising a tuning circuit (48). The tuning circuit (48) is operable to variably modify the resonant frequency of the resonant circuit (18, 46). At its output the antenna resonant circuit (18, 46) provides a phase correlation signal having a known relationship to the frequency difference between the resonant frequency and the powering signal. A phase comparator (60) then receives the powering signal and the phase correlation signal and correspondingly adjusts the resonant frequency of the resonant circuit (18, 46) based upon the known phase relationship. Other devices, systems and methods are also disclosed.

33 Claims, 8 Drawing Sheets

AUTOMATIC ANTENNA TUNING METHOD AND CIRCUIT

CROSS-REFERENCE TO RELATED PATENTS

The following coassigned patent applications are hereby incorporated herein by reference:

| Pat No./Appl. No. | Filing Date | TI Case No. |
| --- | --- | --- |
| 5,053,774 | 2/13/91 | TI-12797A |
| 5,170,496 | 6/15/90 | TI-14198 |
| 07/981,635 | 11/25/92 | TI-16688 |

FIELD OF THE INVENTION

This invention generally relates to a method of matching the resonant frequency of an antenna resonant circuit to the output frequency of a transmitter output stage.

BACKGROUND OF THE INVENTION

Without limiting the scope of the invention, its background is described in connection with Radio Frequency Identification Systems (RFID), as an example. One such RFID system is disclosed in U.S. Pat. No. 5,053,774 by Schuermann et al. and assigned to Texas Instruments Incorporated. Another such system is described in U.S. patent application Ser. No. 07/981,635 by Meier et al., also assigned to Texas Instruments. These systems have interrogators that communicate with transponders. This communication is accomplished in a wireless fashion between an antenna of the interrogator and an antenna of the transponder. The interrogator RF module comprises transmit and receive circuitry for communicating with the transponder through the interrogator antenna. In order for the interrogator to transmit with maximum field strength, the interrogator antenna must be tuned to have a resonant frequency equal to the frequency input from the RF module. Several prior art methods for tuning the antenna to resonance are known.

One prior art method is to measure the power supply current into the supply voltage pin for the transmitter power stage of the RF module. The supply current into this pin will be at a maximum when the resonant frequency of the antenna is equal to the input frequency from the RF module.

Another prior art tuning method is to measure the field strength generated by the RF module into the antenna. In this method, a pickup coil is placed in proximity to the antenna. In the pickup coil an RF voltage is induced by the RF transmissions from the antenna. When the antenna is tuned to resonance, the induced voltage at the pickup coil will reach its maximum value. The difficulty with these prior art methods is the fact that to find the maximum current or measured field strength one must sweep the frequency of the antenna over a known frequency range then select the frequency at which the peak occurred.

SUMMARY OF THE INVENTION

The heretofore unrecognized problem in the art is the fact that prior art systems have no absolute measurement by which a decision whether to increase or decrease the tuned frequency of the antenna can be made. The preferred embodiment of the present invention solves this problem and others by providing a signal that when compared to the signal input from the RF module provides an absolute indication of whether the resonant frequency of the antenna circuit is less than, greater than, or approximately equal to, the input signal from the RF module.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
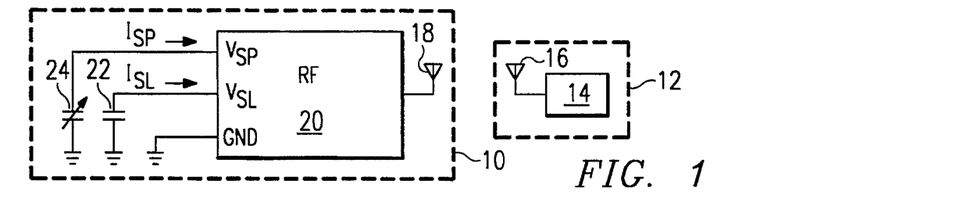
FIG. 1 is a block diagram of an RFID system comprising an interrogator and a transponder.

FIG. 1 shows a block diagram of an RFID system. In this system an interrogator 10 is operable to send RF interrogations to a transponder 12. The transponder 12 has an antenna 16 and control circuitry 14. The interrogator 10 has an antenna 18 and an RF module 20. The interrogator 10 is preferably constructed to be held in the hand of an operator and to transmit an RF interrogation pulse. The transponder 12 is preferably a small, self-contained unit having no power source of its own. Interrogator 10 also can receive RF signals from the transponder 12 and detecting information contained in the RF signals. According to this embodiment transponder 12 replies to the transmission of an RF interrogation pulse by sending back the RF signal having the same frequency as the interrogation pulse. Preferably the RF signal is modulated with data by the transponder 12 using frequency shift keying (FSK) modulation. Operating power is supplied to the RF module 10 by a logic power supply 22 and a transmitter power supply 24. The current, $I_{SL}$, from logic power supply 22 is supplied to the $V_{SL}$ input of the RF module 20. The transmitter operating current, $I_{SP}$, is provided by the transmitter power supply 24 to the input $V_{SP}$ input of the RF module 20.

Figure 2:
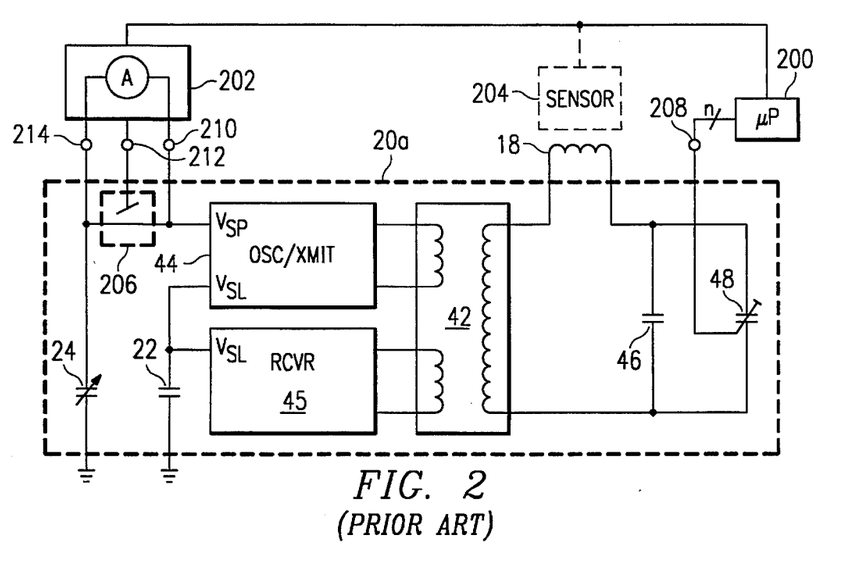
FIG. 2 is a block diagram of a prior art interrogator tuning arrangement.

FIG. 2 is a block diagram of a prior art interrogator tuning arrangement. In this prior art embodiment, an RF module 20a is provided which is in electrical communication with an antenna 18. The antenna 18 is coupled to osc/xmit circuitry 44 and receiver circuitry 45 through a transformer 42. The osc/xmit circuitry 44 is powered at its $V_{SP}$ input that provides power for the oscillator to continue to oscillate and for a transmitter to drive the antenna 18. The voltage for the $V_{SP}$ input is provided by transmitter power supply 24. The $V_{SL}$ inputs to osc/xmit circuitry 44 and receiver circuitry 45 and provides power for the receive and transmit logic. Voltage for the $V_{SL}$ input is provided by logic power supply 22. Antenna 18 and capacitor 46 makeup the antenna resonant circuit 18, 46. Tuning in the prior art is provided by a microprocessor 200 that is typically external to the RF module 20a and connected to the tuning circuit 48 in the RF module 20a via connection 208.

Figure 3:
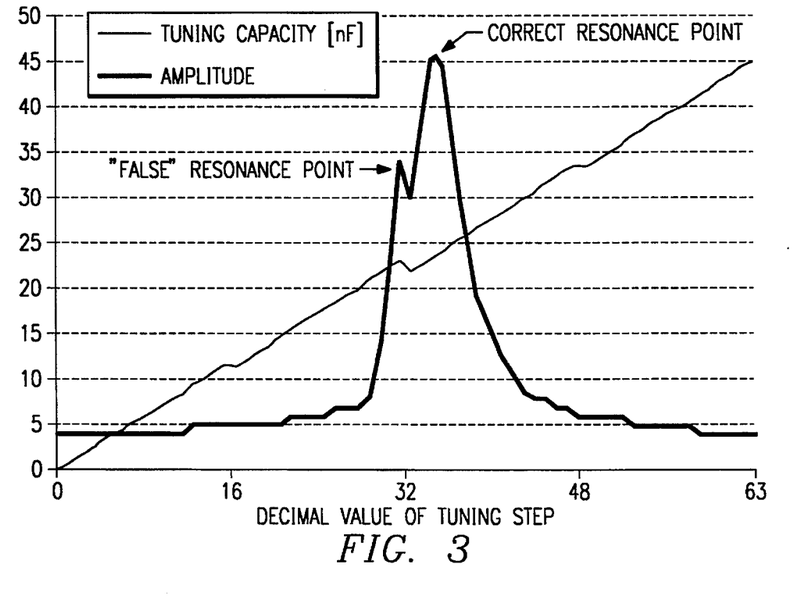
FIG. 3 is a magnitude plot of the output of the resonant circuit v. the decimal value of the tuning step.

Still referring to FIG. 2, one prior art method of measuring the degree of tuning between the antenna resonant circuit 18, 46 and the osc/xmit circuitry 44 is to measure the power supply current into the supply voltage pin, $V_{SP}$, for the osc/xmit circuitry 44 of the interrogator 10. The supply current into this pin will be at a maximum when the resonant frequency, $f_{res}$, of the antenna resonant circuit 18, 46 is equal to the input frequency, $f_{osz}$ from the prior art RF module 20a. The ammeter 202 provides a current measurement to the microprocessor 200. As mentioned, the difficulty with the prior art is that now the microprocessor 200 must go through a tuning process by which the resonant frequency, $f_{res}$, of the resonant circuit 18, 46 is made nearly equal to the input frequency, $f_{osz}$, of the prior art RF module 20a. Without the benefit of an absolute measurement by which it can be determined if a peak has been reached, at least one measurement must be taken at both sides of the peak. The microprocessor 200 of the prior art thus must have a memory of at least the previous measurement and must continue the tuning process until the measurements stop increasing and begin to consistently decrease. The other difficulty is that of the false resonant frequency. As shown in FIG. 3, the amplitude of resonance is not constantly increasing with tuning steps because manufacturing tolerances of tuning capacitors typically used in the tuning circuit may cause the tuning circuit 48 not to monotonically increase in capacitance as the input frequency, $f_{osz}$, is approached. Because of this difficulty, it is necessary to check at least one other measurement after the measured amplitudes have stopped increasing and began decreasing to ensure the true peak has been passed. The other difficulties with this method come with making connections from the ammeter 202 to the prior art RF module 20a. Further, a connection 208 from the microprocessor 200 to the tuning circuit 48 of the prior art RF module 20a must be made. Additionally, connections 210, 212, 214 must be made to connect the ammeter 202 and a switch 206 in series with the $I_{SP}$ supply line. It is of course possible to embed all the extraneous tuning circuitry including the microprocessor 200 and the ammeter 202 in the RF module 20a to avoid having external connections. Embedding this circuitry, however, increases the difficulty of making changes to the tuning procedure by changing the microprocessor programming. Further, the cost, size, and power consumption of the prior art RF module 20a may be increased by embedding this circuitry therein.

Also shown in FIG. 2 is an alternative embodiment for measuring the degree of tuning between the prior art RF module 20a and the antenna resonant circuit 18, 46. In this embodiment, instead of the ammeter 202, a pickup coil or sensor 204 may be placed in close proximity to the antenna 18 to measure the field strength generated by the prior art RF module 20a driving the antenna 18. An RF voltage is induced in the pickup coil 204 by the antenna 18. The pickup coil 204 may then transmit the field strength information to the microprocessor 200 through the external connection 208, just as the ammeter 202 transmitted the current, $I_{SP}$, information. This embodiment from this point has the same disadvantages of not having absolute measurements with which to determine a peak and of having false peaks as shown in FIG. 3. Further this embodiment also requires an external connection from the microprocessor 200 to the prior art RF module 20a.

Figure 4:
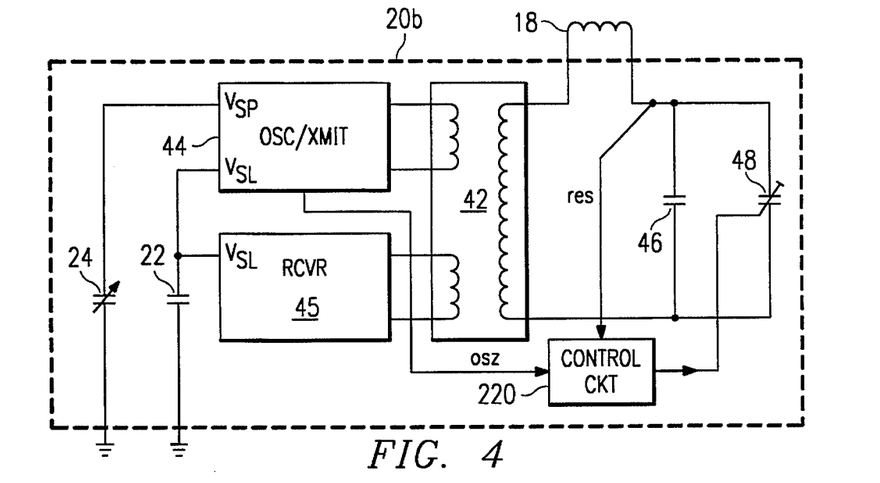
FIG. 4 is a block diagram of the preferred embodiment interrogator tuning arrangement.
Figure 5A:
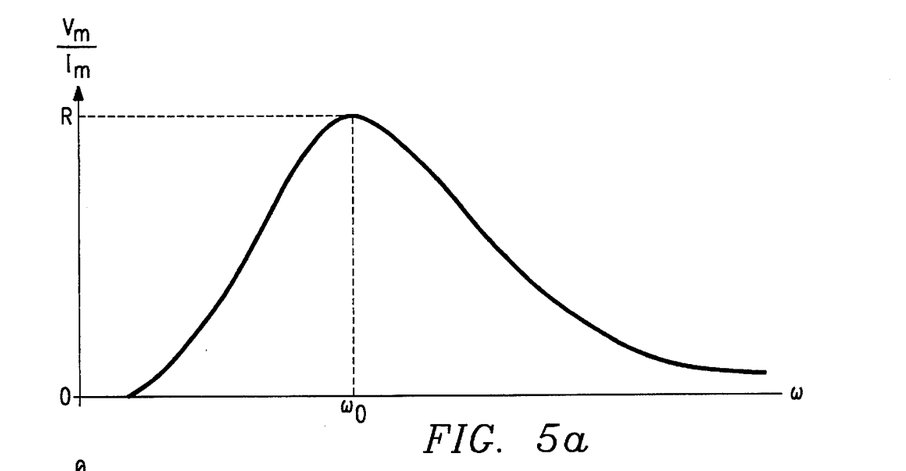
FIGS. 5a and 5b are Bode plots of the magnitude and phase characteristics, respectively, for a resonant circuit about its resonant frequency.
Figure 5B:
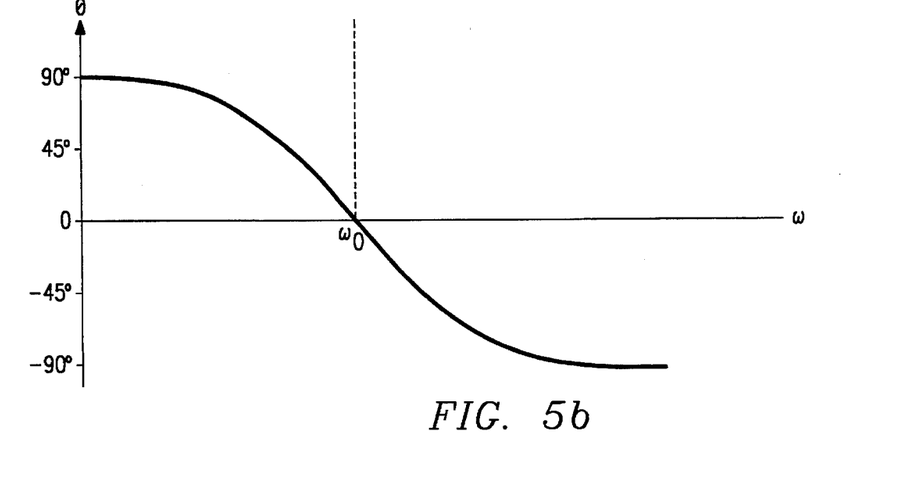

FIG. 4 is a block diagram of the preferred embodiment interrogator tuning arrangement. An RF module 20b is provided which is in electrical communication with an antenna 18. The antenna 18 is coupled to osc/xmit circuitry 44 and receiver circuitry 45 through a transformer 42. The osc/xmit circuitry 44 is powered at its $V_{SP}$ input, which provides power for the oscillator to continue to oscillate and for a transmitter to drive the antenna 18. The voltage for the $V_{SP}$ input is provided by transmitter power supply 24. The $V_{SL}$ inputs to osc/xmit 44 and receiver 45 circuitry provide power for the receive and transmit logic. Voltage for the $V_{SL}$ input is provided by logic power supply 22. Antenna 18 and capacitor 48 makeup the antenna resonant circuit 18, 46. Tuning in the preferred embodiment is provided in a control circuit 220, which receives a reference signal "osz" from the osc/xmit stage 44. The control circuit compares the phase of the signal "osz" to the "res" signal. The preferred embodiment makes use of a characteristic of resonant circuits that is illustrated in FIGS. 5a–5b. This characteristic is the transfer function of a resonant circuit 18, 46 induces a phase lead to a signal that has a frequency, $f_{osz}$, of less than the resonant frequency, $f_{res}$, of the resonant circuit 18, 46 and a phase lag to a signal that has a frequency, $f_{osz}$, of greater than that resonant frequency, $f_{res}$, of the resonant circuit 18, 46. This characteristic transfer function of a resonant circuit is shown in the Bode plots of magnitude and phase in FIGS. 5a–5b. With this knowledge, the method preferably adjusts the resonant frequency of the resonant circuit 18, 46 using the tuning circuit 48 until the phase lead/lag is reduced to within a pre-defined tuning error. The phase difference between these two signals is now an absolute measurement, which can be used to great advantage in the present invention. The tuning method will be described in greater detail herein, but generally provides a less expensive, faster technique.

Figure 6:
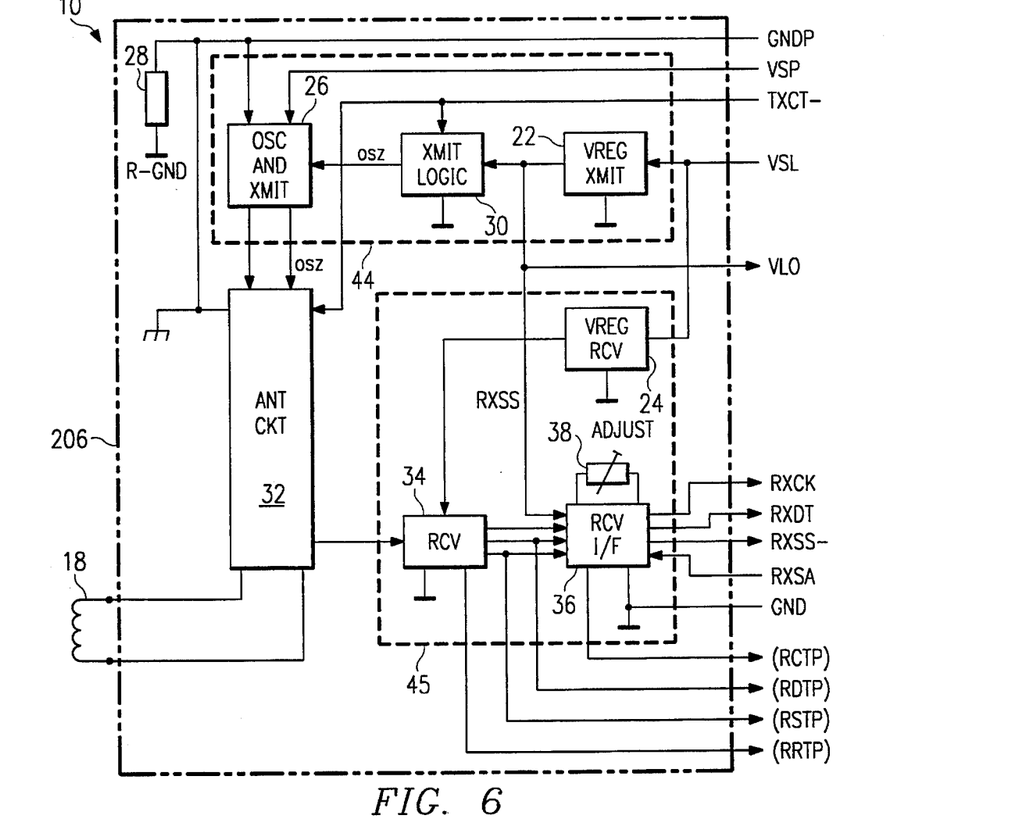
FIG. 6 is a block diagram of the preferred embodiment interrogator.

FIG. 6 is a block diagram of a preferred embodiment interrogator 10. The interrogator 10 receives operating power at inputs $V_{SP}$ and $V_{SL}$. The RF module 20b has built-in supply voltage regulators 22, 24 for the transmit logic 30 and the receive logic 34. These regulators 22, 24 regulate the voltage between $V_{SL}$ and GND. The osc/xmit stage 26 receives its supply voltage over lines $V_{SP}$ and GNDP. Inside the RF module 20b, the power ground line GNDP is decoupled from GND by the resistor 28. The transmitter control logic 30 generates a transmitter clock signal "osz" of frequency, $f_{osz}$, from a crystal controlled oscillator (not shown). The transmitter clock signal is amplified by the osc/xmit stage 26 and is provided to the antenna circuit 32 of the RF module 20b. The transmitter logic 30 is active since the transmitter control line TXCT_ is "low."

The selective receiver 34 amplifies and demodulates the FSK signal received from the antenna 18. The receiver interface 36 converts the demodulated signal to LS-TTL and HCMOS-logic compatible data signals RXCK and RXDT, which contain the data, control and check bits. Conversion of the demodulated signal to logic levels occurs only after the TXCT_signal is active for a minimum time of $TX_{min}$. After the TXCT_signal has become inactive, the conversion occurs for a minimum time of $TRX_{min}$. The signal RXCK is a reference clock signal used to decode the RXDT data stream. The RXCK signal changes from "low" to "high" level in the middle of each data bit.

The signal RXSS_ switches to "low," if the received RF signal strength exceeds a predefined level, which can be adjusted with potentiometer 38 in the RF module.

Figure 7:
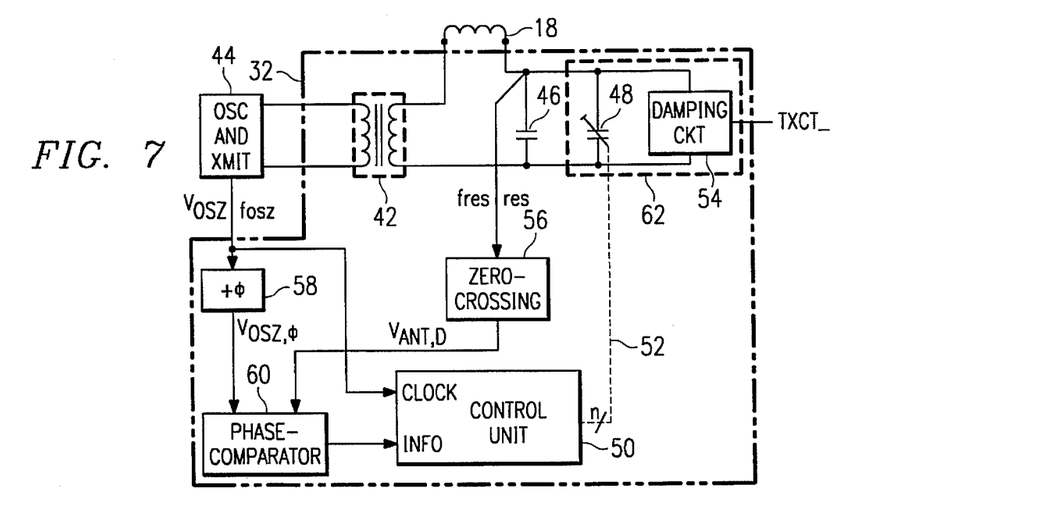
FIG. 7 is a block diagram of the antenna circuit of the preferred embodiment interrogator.

The interrogator antenna 18 is preferably a coil, which is driven by the antenna circuit 32 (see also FIG. 7). As mentioned, for optimal operation of the transmit and receive function, the antenna resonance circuit 18, 32 must be tuned to the transmit frequency, $f_{osz}$.

The interrogator antenna 18 should have a high quality factor. In the preferred embodiment this antenna uses an RF litz-wire with a maximum single wire diameter of 0.1 mm. Preferably the litz wire will have at least 120 single insulated wires.

FIG. 7 is a block diagram showing the antenna circuit 32 and the osc/xmit stage 26 in greater detail. The osc/xmit stage has osc/xmit circuitry 44 that is connected to antenna resonance circuit 18, 46 through transformer 42. With a capacitor 46, coil 18 forms an antenna resonance circuit 18, 46. Tuning circuit 48 is provided in parallel to capacitor 46 so that the resonance frequency of the antenna resonant circuit 18, 46 may be adjusted. A control circuit 50 is provided to control the tuning circuit 48 over a tuning bus 52. Tuning bus 52 has a predetermined number of connections depending on the number of tuning capacitors within the tuning circuit 48. A damping circuit 54 is provided to enable fast reception from the transponder 12 after TXCT_ has been low (active). The osc/xmit circuitry 44 provides a first signal to the input of transformer 42 that in turn provides a second signal as its output to antenna resonance circuit 18, 46. A signal, "osz," is provided from the osc/xmit circuitry 44 to a phase shifter 58 and a control unit 50. The signal "osz" is a reference signal that has the same phase and frequency as the first signal provided to the transformer 42. The antenna resonant circuit 18, 46 is tuned to the output of the osc/xmit stage 44 by providing the output of the transformer 42 as a second signal in response to the first signal. In the antenna circuitry 32 a tuning circuit 48 is provided in parallel with the capacitor 46, the tuning circuit 48 being selectable to variably modify the resonance frequency of the resonant circuit 18, 46 from the initial resonance frequency of the parallel combination of the coil 18 and the capacitor 46. At the antenna resonant circuit 18, 46 a phase correlation signal, "res," is provided, the form of "res" being substantially a sine wave having an apex that lags the falling edge of the first signal when the resonance frequency, $f_{res}$, of the antenna circuit 18, 46 is less than the frequency, $f_{osz}$, of the first signal, "osz." The falling edge of the phase correlation signal, "res," is approximately at the falling edge of the first signal when the resonance frequency $f_{res}$ of the antenna circuit 18, 46 is approximately at the frequency, $f_{osz}$, of the first signal, "osz." The falling edge of the phase correlation signal, "res," leads the falling edge of the first signal, "osz," when the resonance frequency, $f_{res}$, of the antenna circuit 18, 46 is greater than the frequency, $f_{osz}$ of the first signal, "osz."

In the preferred embodiment of the invention, the magnitude of the phase difference between the apex of the sine wave and the falling edge of the first signal is called the phase difference. The phase difference monotonically decreases as the resonant frequency, $f_{res}$, of the antenna tuned circuit 18, 46 approaches that of the first signal. In the exemplary application, a zero crossing detector 56 receives the correlation signal, "res," and conditions this signal to be substantially a square wave for compatibility with digital logic circuitry. Still further included in the exemplary embodiment is a phase shifter 58 that induces a phase shift in the first signal to correspond to the phase shift that is inherently induced in the zero crossing detector 56.

A comparator 60 then receives the outputs of the zero crossing detector 56 and the phase shifter 58. Comparator 60 then provides an output of a first logic level when the output of the zero crossing detector 56 is of lesser amplitude than the output of the phase shifter 58 or of a second logic level when the output of the zero crossing detector 56 is of greater amplitude than the output of the phase shifter 58. A control circuit 50 is provided for adjusting the resonant frequency, $f_{res}$, of the resonant circuit 18, 46 by controlling tuning circuit 48 in response to the signals received from the comparator 60. The details of how the comparator 60 and tuning circuit 58 respond to the signals received from phase shifter 58 and from zero crossing detector 56 to effect automatic tuning of the antenna resonant circuit 18, 46 will be described in greater detail hereinbelow.

Figure 8:
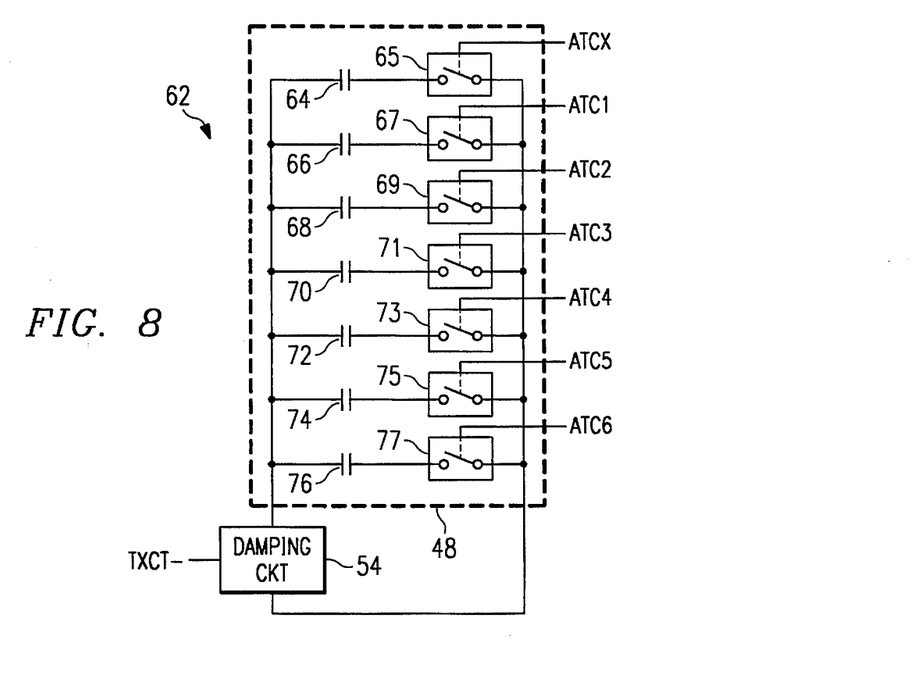
FIG. 8 is a schematic diagram of the preferred embodiment tuning circuit.

FIG. 8 is a schematic diagram of the tuning circuit 48. It receives inputs ATC1, ATC2, ATC3, ATC4, ATC5, ATC6 and ATCX from tuning bus 52. The input ATC1 closes the switch 67 that connects a capacitor 66 having a weighted value of "one" in parallel with capacitor 46. The input ATC2 closes the switch 69 that connects a capacitor 68 having a weighted value of "two" in parallel with the capacitor 46. The input ATC3 closes the switch 71 that connects a capacitor 70 having a weighted value of "four" in parallel with the capacitor 46. Inputs ATC4, ATC5 and ATC6 act in a similar manner for capacitors 72, 74, 76 having binarily increasing weighted values of 8, 16, and 32, respectively. In one preferred embodiment of the invention, another capacitor 64 is provided in series with the switch 65 controlled by input ATCX. The procedures for controlling these switches will be described in greater detail during discussion of FIGS. 13–15.

Figure 9:
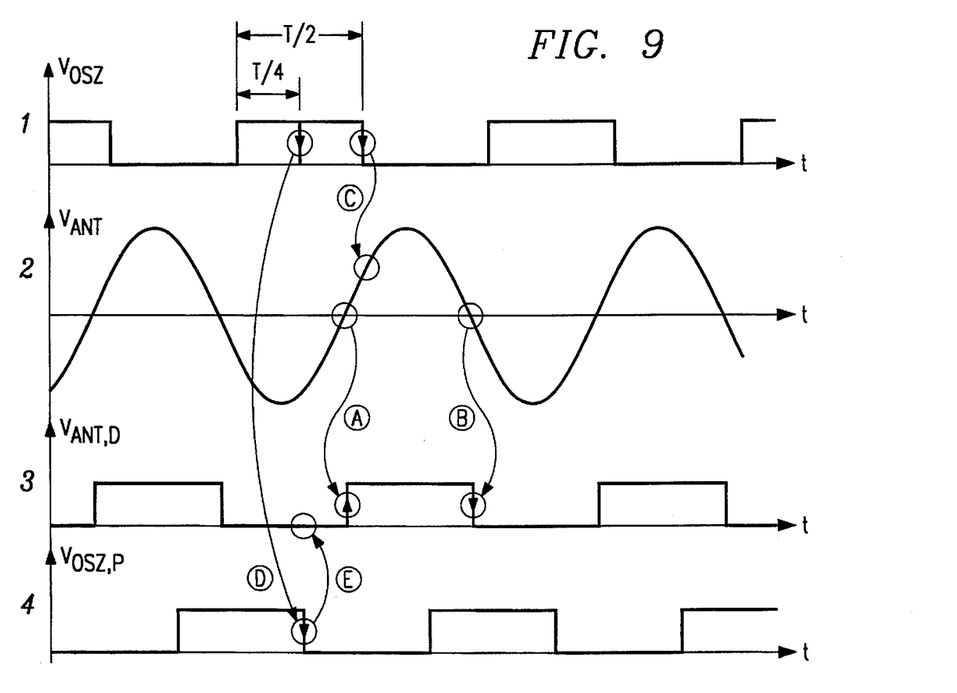
FIG. 9 is a waveform graph for an antenna circuit having a resonant frequency less than that of the input signal received from the RF module.

FIG. 9 is a waveform graph for an antenna circuit having a resonant frequency, $f_{res}$, less than the frequency, $f_{osz}$, of the reference signal received from the RF module. Signal 1 of FIG. 9 shows the reference signal from the RF module transmitter. Markings showing a half oscillation period (T/2) and a quarter oscillation period (T/4) are shown. Signal 2 of FIG. 9 shows the voltage at the antenna circuit 18, 48. Signal 3 is generated from Signal 2 by the zero-crossing circuit 56. Signal 4 is generated by the phase shifter 58 from Signal 1. The zero-crossing circuit 56 receives Signal 2 and converts the signal into a digital format for compatible operation with the logic circuitry. Arrows "A" and "B" show the correspondence between the zero crossings of Signal 2 and the transitions of Signal 3. Arrow "C" shows the raw resonance criteria between $V_{oxz}$ and $V_{ant}$. AS can be seen by Arrow "C," the falling edge of the oscillator reference signal, Signal 1, leads the peak of the voltage at the antenna circuit 18, 46 in this condition. To facilitate phase comparisons, however, it is desirable to shape Signal 2 as shown in Signal 3 by a zero crossing detector 56. It is further desirable to facilitate these comparisons by phase shifting the reference signal, Signal 1, by phase shifting it to form Signal 4 as shown by Arrow "D." In this way a usable resonance criteria is formed in which the phase of the output of the zero crossing detector 56, Signal 3, is compared to that of the output of the phase shifter 58, Signal 4. For the raw resonance criteria, the transition of Signal 1 corresponds at the tuned frequency when to the peak of Signal 2. In the tuned condition for the usable resonance criteria, however, the signals Signal 3 and Signal 4 will both have simultaneous transitions. In FIG. 9, Arrow "E" shows that the falling edge of Signal 4 leads the rising edge of Signal 3, indicating that the resonant frequency of the antenna circuit 18, 46 is still less than the received reference signal. Although the relationship between Signals 3 and 4 has been described as the "usable" correlation criterion, this does not imply that the phase relationship between any other signals is not usable.

Figure 10:
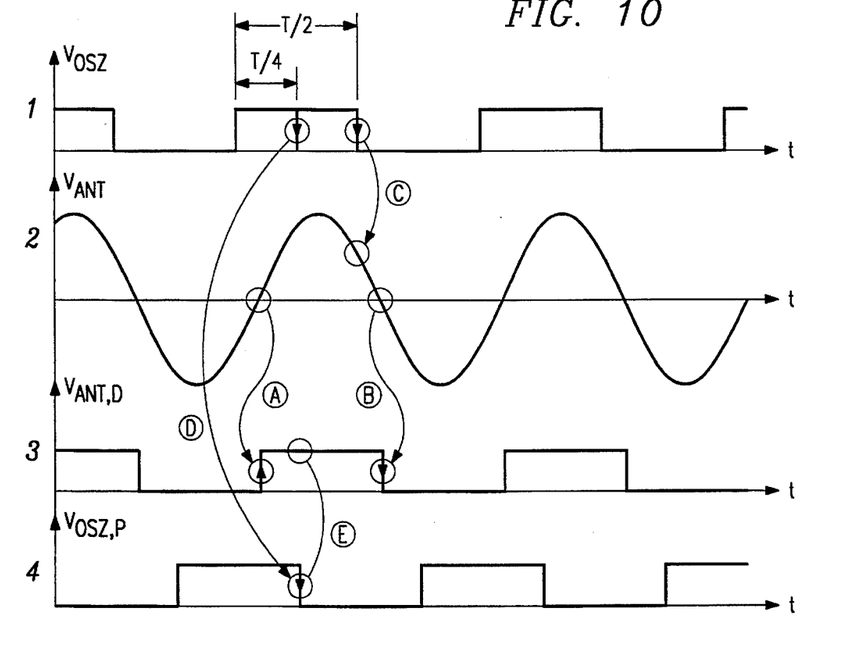
FIG. 10 is a waveform graph for an antenna circuit having a resonant frequency greater than that of the input signal received from the RF module.

FIG. 10 is a waveform graph for an antenna circuit 18, 46 having a resonant frequency greater than that of the reference signal received from the RF module. This figure shows the usable resonance criteria similarly to FIG. 9, but in this instance the falling edge of Signal 4 lags the rising edge of Signal 3, indicating that the resonant frequency of the antenna circuit 18, 46 is greater than the received reference signal.

Figure 11:
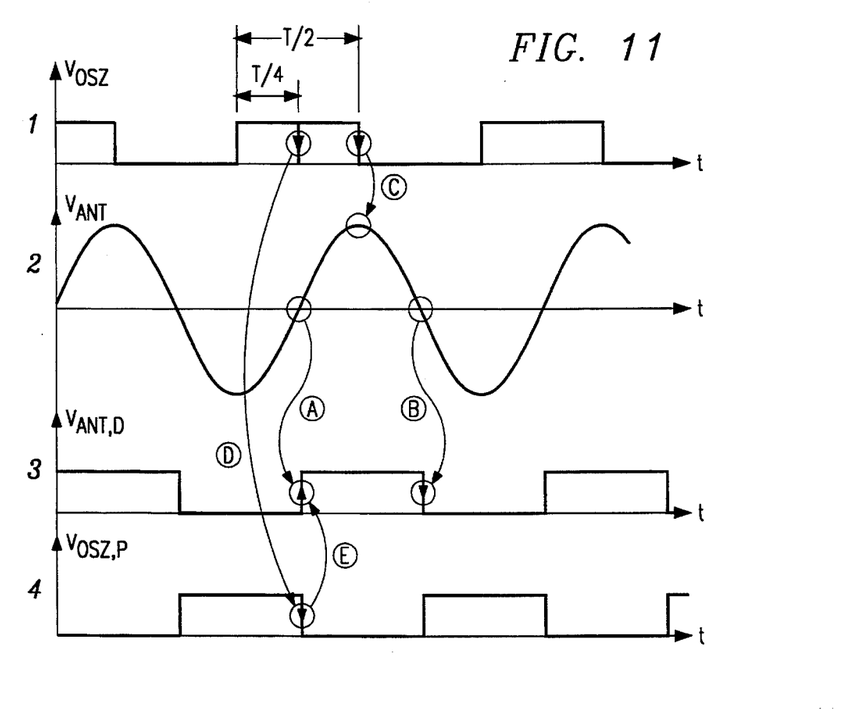
FIG. 11 is a waveform graph for an antenna circuit having a resonant frequency approximately equal to that of the input signal received from the RF module.

FIG. 11 shows the waveform graph for an antenna circuit having a resonant frequency approximately equal to that of the signal received from the RF module. As earlier stated, in this condition the falling edge of Signal 4 will occur simultaneously with the rising edge of Signal 3. Although the magnitude of the signal at the antenna circuit 18, 46, $V_{ant}$ is shown to be approximately equal in all four graphs, the magnitude will actually be greatest as the antenna resonance frequency, $f_{res}$, approaches that of the reference signal, $f_{osz}$.

Figure 12:
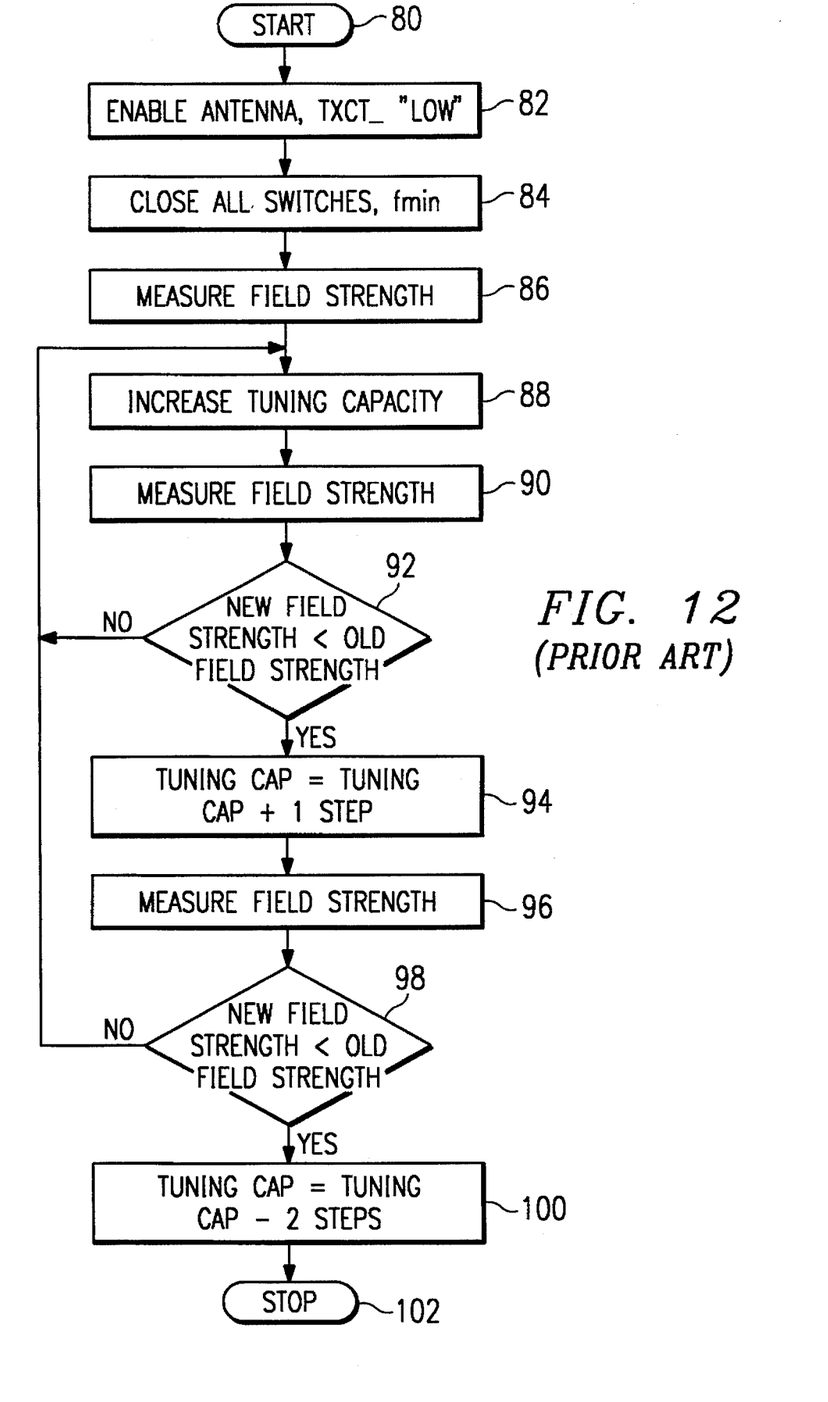
FIG. 12 is a flow diagram for a prior art method of tuning the interrogator antenna.

FIG. 12 is a flow chart illustrating the procedure for tuning an antenna circuit in the prior art. From the start block 80, the procedure begins at block 82 where the antenna circuit is enabled by the signal TXCT__. Since this signal is a "low" active signal then the antenna is enabled by taking the signal "low." Once the antenna is enabled, the relative degree of tuning can be measured using known prior art techniques, such as measuring the field strength in proximity to the antenna 18 or measuring the current into the osc/xmit stage 26. The next step occurs at block 84 at which the frequency is set to a minimum, $f_{min}$ by closing all the switches, 65, 67, 69, 71, 73, 75, 77 of the tuning/damping circuit 62. This gives the tuning procedure a known starting point from which a consistent method can be used. The next step is at block 86 in which the field strength is measured by the field strength detector 202 in close proximity to the antenna 18 or at which the current into the osc/xmit stage 26 is measured by ammeter 204 in series with the $V_{SP}$ supply voltage. As mentioned, the difficulty with the prior art tuning method comes from having always to compare the strength of the oscillation in the antenna resonance circuit 18, 46 and at a first and a second frequency. Since at this stage in the process, the amplitude has only been measured once at block 86, a second reading must be taken at a new frequency, thus at block 88 the tuning capacity of the tuning circuit 48 is increased by one step. The weighting increments might be in binary steps for a set of binarily-weighted capacitors. Depending on the method, however, another step size might be used. For example, the weighting increments might be in logarithmic steps for a set of logarithmically weighted capacitors. The logarithmic steps used would be a design choice, following the general logarithmic equation $f(x)=\log_a(bx+c)+d$. Now at block 90 the field strength is measured again. At decision block 92 the new field strength is compared to the old field strength. If this new field strength is greater than the old field strength, then the method returns to block 88 and blocks 88 and 90 are repeated. A new decision is then made at 92 using the newest field strength measurement at block 90 and the previously-measured field strength from block 90. If, however, at block 92 the new field strength is less than the old field strength, the procedure moves to block 94 where the tuning capacitance is increased by another tuning step. The field strength is then measured again at block 96 and again a new decision block 98 is encountered. This new field strength is compared to the prior field strength this time as measured in block 90. If this field strength is greater than the old field strength, the execution again returns to block 88 to repeat this procedure. If the new field strength is less than the old field strength, the method goes on from block 100 where the tuning capacitance is decreased by two steps to compensate for the two step increases in tuning capacity at blocks 88 and block 94. The step 100 is necessary because in this method it is not known when the correct tuned frequency has been exceeded until the measured field strengths or current begins to decrease from its peak. Thus, the two steps in which the field strength decreased while the tuning circuit determined that the optimal resonant frequency had been exceeded must be undone. The reason that blocks 88, 90, 92 are essentially repeated as blocks 94, 96, 98 comes from the need to guard against reading a false peak as the correct tuned resonance frequency. False peaks occur because the resonant frequency is not monotonically increasing with the binary tuning steps. The difficulties with the prior art method can be seen in this method in that the resonance peak is not known until it has been passed and in that false peaks may exist. The false peaks must be discriminated from the desired frequency at which the antenna resonant circuit 18, 46 has a resonant frequency $f_{res}$ equal to the transmitter frequency, $f_{osz}$.

Figure 13:
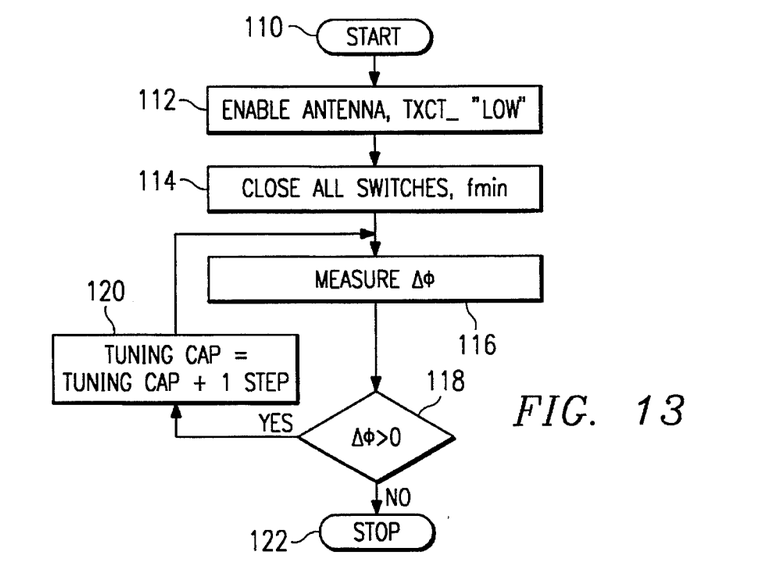
FIG. 13 is a flow diagram for a first method of tuning the interrogator antenna.

FIG. 13 illustrates the improved tuning procedure using the phase correlation criterion. This procedure continues from the start block 110 and block 112 in which the antenna is enabled by a low assertion of TXCT__. The procedure continues at block 114 at which all switches are closed to set the frequency of the tuned circuit to its minimum, $f_{min}$. At block 116 a phase difference is calculated between a signal measured directly at the antenna resonance circuit, "res," and a reference signal, "osz," received directly from the osc/xmit stage 28. At decision block 118 a simple criterion is used to determine if the tuning procedure should continue. If the phase difference between "res" and "osc" is greater than zero, the tuning procedure continues. If at decision block 118 the frequency difference is greater than zero, the procedure continues to block 120 where the tuning capacitance of the tuning circuit is increased by one binary step. The frequency difference is measured again at block 116 and the decision at block 118 is repeated until the phase difference changes signs from positive to negative. As the frequency is increased in steps from $f_{min}$ by the tuning circuit, the phase difference will gradually decrease in magnitude until it changes sign when $f_{res}$ becomes greater than $f_{osz}$. Of course the procedure ends at stop block 122.

Figure 14:
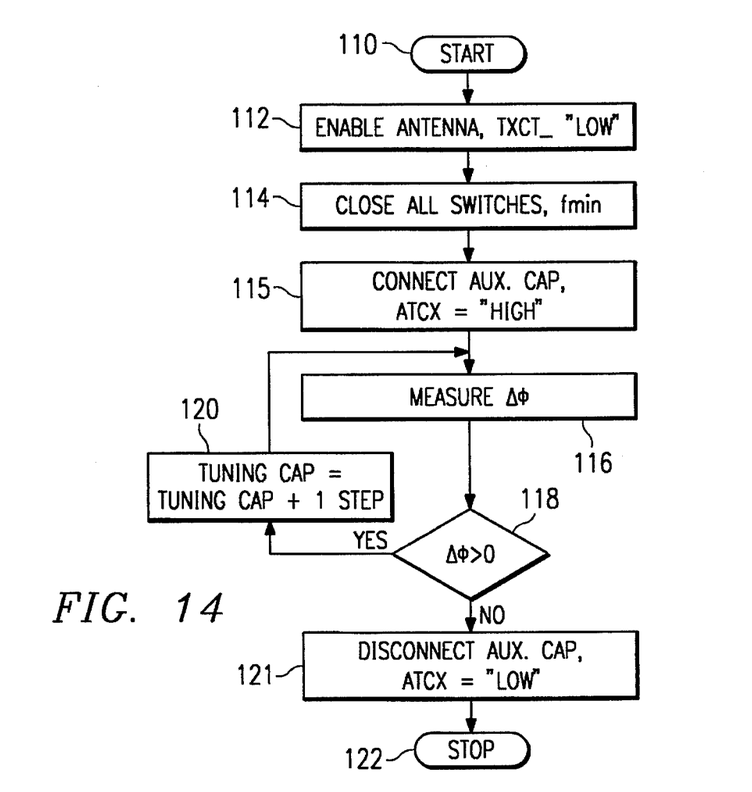
FIG. 14 is a flow diagram for a second method of tuning the interrogator antenna.

FIG. 14 shows an alternative inventive method for tuning an antenna circuit. This procedure is the same as that described in FIG. 13, except for two steps that are inserted.

Step 115 is inserted between step 114 and 116. Step 115 consists of connection of the auxiliary capacitor 64 in parallel with the capacitor 46. Auxiliary capacitor 64 is connected to capacitor 64 by switch 65 that is controlled by input ATCX. Auxiliary capacitor 64 has a magnitude of half that of the capacitance of the smallest tuning capacitor. The normal tuning procedure is initiated at this point until again the frequency difference changes signs from positive to negative at decision block 118. At this time the auxiliary capacitor 64 is disconnected at block 121. The difference between this procedure and the procedure of FIG. 14 is like the difference between truncation and rounding. The prior method of FIG. 13 is like truncation in that the procedure continues until the target frequency is exceeded, thus the frequency error between the antenna resonant circuit can be up to +1 step and of course will never be less. In the method of FIG. 14, the auxiliary capacitor 64 has half the value of the minimum tuning capacitor. The auxiliary capacitor 64 is disconnected after the tuning procedure has been completed, thus the most frequency $f_{res}$ of the antenna resonant circuit 18, 46 can exceed that of the input signal is +½ step. The frequency $f_{res}$ of the antenna resonant circuit 18, 46 can also be up to −½ step less than $f_{osz}$. Thus, the maximum tuning error has been reduced from 1 to ½ tuning step.

Figure 15:
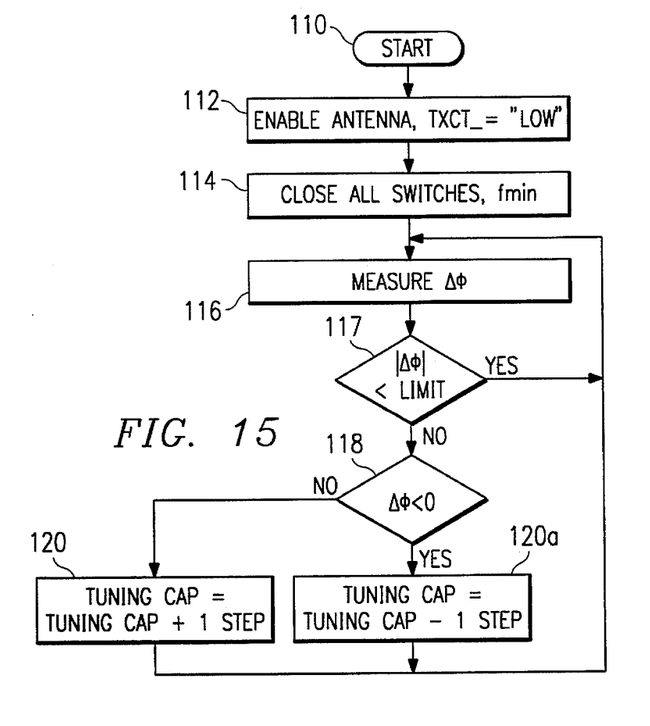
FIG. 15 is a flow diagram for a third method of tuning the interrogator antenna.

With the described tuning methods, tuning is possible even during the powering burst because the magnitude of the oscillation within the antenna resonance circuit 18, 46 is not used as a measurement. An exemplary tuning method shown in FIG. 15 might be called "Dynamic Auto Tuning" in which the antenna resonance circuit 18, 46 is tuned dynamically each read/write cycle as shown in the flowchart of FIG. 15. This method is similar to the ones described in FIGS. 13–14, but it also includes a step 117 which checks the phase difference to see if it is within an acceptable limit $|\Delta\phi|$. If the phase difference is outside of the acceptable range, the sign of the phase difference is checked to see if the frequency, $f_{res}$, of the antenna resonance circuit 18, 46 should be lowered or raised. Depending upon the sign of this phase difference, a step 120 or 120a is then executed, before the dynamic tuning circuit returns to step 116. The "Dynamic Auto Tuning" method is very useful in instances where the antenna 18 is subject to detuning at any time such as from a metal object in close proximity to the antenna 18.

The three procedures detailed in FIG. 13–15 are but examples of procedures that can be used advantageously with the phase correlation criterion. Many other methods are foreseen by the applicant. For example, successive approximation adjustments could be used to more quickly tune the resonant circuit. Successive approximation can not be used in the prior art circuit because an absolute criterion must be used to determine if and how much the capacity of the resonant circuit must be increased or decreased. As mentioned, the tuning steps might be binary steps or they might be logarithmic or other weightings could be used.

Since the described tuning methods are so much faster than prior known methods, tuning can be accomplished with each transmit burst if desired. The simplicity of this method allows the tuning to be accomplished with a hardware implementation. The prior art methods require more sophisticated, more complex circuitry in which a new strength measurement must be compared to an old measurement. Thus, memory must be used with the prior art methods. Furthermore, the phase correlation criterion is less dependent on temperature than the magnitude of the oscillation within the antenna resonance circuit 18, 46. Thus the tuning of the preferred embodiment resonant circuit 18, 46 is less dependent on temperature than prior art methods.

Figure 16:
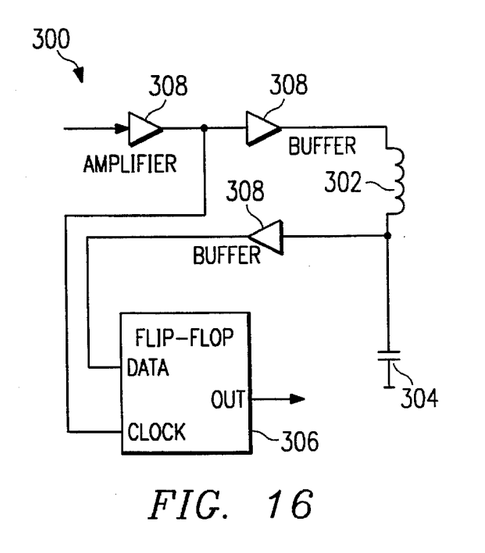
FIG. 16 is a block diagram of a preferred embodiment demodulation circuit employing the phase correlation criterion.

FIG. 16 applies the same principles used hereinabove for use as an FSK data demodulator 300. A resonant circuit is formed from the parallel combination of coil 302 and capacitor 304. In this embodiment, the resonant frequency, $f_{res}$, of resonant circuit 302, 304 is selected to be between the two modulated FSK frequencies, $f_1$ and $f_2$. The buffers 308 provide isolation in the normal fashion. As described hereinabove, when the input frequency is $f_1$, where $f_1$ is less than $f_{res}$, the output of the comparator or flip-flop 306 has a first value. When the input frequency is $f_2$, where $f_2$ is greater than $f_{res}$, the output of the comparator 306 will have another value.

Figure 17:
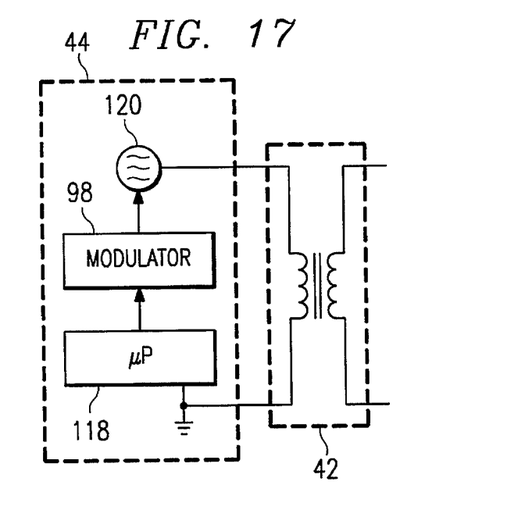
FIG. 17 illustrates a generalized osc/xmit circuit shown as a block in FIG. 7.

FIG. 17 illustrates generalized osc/xmit circuitry 44 that is connected to antenna resonance circuit 18, 46 (not shown, see FIG. 7) through transformer 42. A modulator 98 operates under the control of microprocessor 198 to modulate the powering signal at the carrier wave generator 120 with information to be transmitted to the transponder 12.

The sole table, below, provides an overview of the embodiments and the drawings:

TABLE

| Drawing Element | Generic Term | Preferred or Specific Terms | Alternate Terms |
| --- | --- | --- | --- |
| 10 | Interrogator | | Reader |
| 12 | Transponder | | Responder |
| 14 | Control Circuit | Transponder Control Circuit | Transponder Controller |
| 16 | Antenna | Resonant Circuit | Transponder Antenna |
| 18 | Antenna | Coil | Interrogator Antenna |
| 20 | RF Module | | Xmit/Rcv Circuit |
| 20a | RF Module | Prior Art RF Module | Xmit/Rcv Circuit |
| 20b | RF Module | Preferred RF Module | Xmit/Rcv Circuit |
| 22 | Logic Power Supply | | Supply Voltage Regulator |
| 24 | Transmitter Power Supply | | Supply Voltage Regulator |
| 26 | Osc/Xmit Stage | | Oscillator/Transmitter Stage |
| 28 | Damping Element | Resistor | |
| 30 | Xmit Logic | | Transmit Logic |
| 32 | Antenna Circuit | | |
| 34 | Receive Stage | | |

TABLE-continued

| Drawing Element | Generic Term | Preferred or Specific Terms | Alternate Terms |
|---|---|---|---|
| 36 | Receive I/F Circuitry | | |
| 38 | Threshold Level Adjustment | RXSS Adjust | Potentiometer |
| 42 | Transformer | | |
| 44 | Osc/Xmit Circuitry | | |
| 45 | Receive Circuitry | | |
| 46 | Capacitor | Resonance Circuit Capacitor | |
| 48 | Tuning Circuit | Capacitor Network | Varicap |
| 50 | Control Unit | Tuning Controller | Tuning Microprocessor |
| 52 | Tuning Bus | | |
| 54 | Damping Circuit | | |
| 56 | Zero-Crossing Circuit | Zero Crossing Detector | |
| 58 | Phase Shifter | | |
| 60 | Phase Comparator | | |
| 62 | Tuning/ Damping Ckt | | |
| 64,66,68, 70,72,74, 76 | Tuning Capacitors | | |
| 65,67,69, 71,73,75, 77 | Tuning Switches | | |
| 98 | Modulator | | |
| 118 | Microprocessor | | |
| 120 | Carrier Wave Generator | | |
| 200 | Microprocessor | | |
| 202 | Ammeter | | |
| 204 | Field Strength Sensor | | |
| 206 | Switch | | |
| 208,210 212,214 | Connection | | |
| 300 | FSK Data Demodulator | | |
| 302 | Coil | | Inductor |
| 304 | Capacitor | | |
| 306 | Comparator | | Flip-Flop, Latch |
| 308 | Amplifier | Buffer | |

A few preferred embodiments have been described in detail hereinabove. It is to be understood that the scope of the invention also comprehends embodiments different from those described, yet within the scope of the claims.

For example, "microcomputer" in some contexts is used to mean that microcomputer requires a memory and "microprocessor" does not. The usage herein is that these terms can also be synonymous and refer to equivalent things. The phrase "processing circuitry" or "control circuitry" comprehends ASICs (application specific integrated circuits), PAL (programmable array logic), PLAs (programmable logic arrays), decoders, memories, non-software based processors, or other circuitry, or digital computers including microprocessors and microcomputers of any architecture, or combinations thereof. Memory devices include SRAM (static random access memory), DRAM (dynamic random access memory), pseudo-static RAM, latches, EEPROM (electrically-erasable programmable read-only memory), EPROM (erasable programmable read-only memory), registers, or any other memory device known in the art. Words of inclusion are to be interpreted as nonexhaustive in considering the scope of the invention.

The invention described herein may be used with types of modulation other than Frequency Shift Keying (FSK). For example, Pulse Width Modulation might be used, wherein the transponder 12 receives a modulated data stream from the interrogator 10 wherein the transponder 12 determines whether a received data bit is a "zero" or a "one" bit by the duration of the time period for which the RF carrier is deactivated. The interrogator 10 communicates or modulates the data by selectively turning on and off a carrier, which would generally have a constant frequency when it was activated. For example, if the duration for which the carrier is deactivated is less than six clock cycles, the data could be defined as "zero" or "low", while if the duration for which the carrier is deactivated is greater than six clock cycles, the data could be defined as a "one" or "high." As another example of a type of amplitude modulation, data may be transferred from the interrogator 10 to the transponder 12 using a modulation scheme known as pulse-pause modulation. At the transponder 12, the oscillations of resonant circuit 16 decay during periods n which the carrier transmissions from the interrogator 10 are discontinued. An end of burst circuit may be used to detect these decreases in amplitude of the oscillations and to represent these periods of reduced amplitude with a positively asserted digital signal that serves as the demodulated signal.

Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of matching a resonant frequency of an antenna resonant circuit to an output frequency of a transmitter output stage, the method comprising the steps of:
    a) providing a powering signal from said transmitter output stage to said antenna resonant circuit;
    b) receiving at said antenna resonant circuit said powering signal, said antenna resonant circuit comprising a tuning circuit, said tuning circuit being operable to variably modify said resonant frequency of said resonant circuit, said antenna resonant circuit having at its output a phase correlation signal, the phase of said phase correlation signal relative to said powering signal having a known relationship to a frequency difference between said resonant frequency and said powering signal;
    c) receiving in a phase comparator said powering signal and said phase correlation signal; and
    d) adjusting the resonant frequency of said resonant circuit in response to a received output of said phase comparator.

2. The method of claim 1 wherein said resonant circuit further comprises an electrically coupled coil and capacitor, which are coupled in turn to said tuning circuit.

3. The method of claim 2 wherein said tuning circuit is a network of parallel capacitors.

4. The method of claim 3 wherein the parallel resonant frequency of said coil and said capacitor is chosen to be less than a known minimum frequency of said powering signal and wherein the resonant frequency of said resonant circuit is adjusted by decreasing the capacity of the tuning circuit in steps until the resonant frequency of said resonant circuit is increased from its initial value to be approximately equal to the frequency of said powering signal.

5. The method of claim 3 wherein said network of capacitors is a set of binary-weighted tuning capacitors to be connected in parallel to said resonant circuit.

6. The method of claim 5 wherein said set of binary-weighted tuning capacitors is done by binary tuning steps such that the capacity of said tuning circuit is increased in approximately linear fashion.

7. The method of claim 5 wherein said set of binary-weighted tuning capacitors is done by successive approximation.

8. The method of claim 3 wherein said network of capacitors is a set of logarithmically-weighted tuning capacitors to be connected in parallel to said resonant circuit.

9. The method of claim 8 wherein said step of adjusting said resonant frequency is effected by enabling or disabling of selected ones of said set of logarithmically-weighted tuning capacitors by adaptive methods whereby the size of the tuning step is proportional to the magnitude of the phase difference between said powering signal and said phase correlation signal.

10. A method of matching a resonant frequency of an antenna resonant circuit to an output frequency of a transmitter output stage, the method comprising the steps of:
    a) providing a powering signal from said transmitter output stage to a powering winding of a transformer, said powering signal being substantially a square wave having rising and falling edges, the frequency of said powering signal not precisely known but known to fall between a minimum and a maximum frequency;
    b) providing by said transformer at a second winding thereof, an antenna signal in response to said powering signal;
    c) receiving at said antenna resonant circuit said antenna signal, said antenna resonant circuit comprising a coil, a capacitor, and a tuning circuit, said coil and said capacitor being serially connected between the first and second terminals of said second winding and defining a resonant circuit output at the connection between said coil and said capacitor, and said tuning circuit being in parallel with said capacitor and being operable to variably modify the resonance frequency of said resonant circuit from the initial resonance frequency of the combination of said coil and said capacitor;
    d) providing at said output of said antenna resonant circuit a phase correlation signal, the form of which is substantially a sine wave having an apex which:
        i) lags the falling edge of said powering signal when the resonance frequency of said antenna circuit is less than the frequency of said powering signal;
        ii) is approximately at the falling edge of said powering signal when the resonance frequency of said antenna circuit is approximately at the frequency of said powering signal; and
        iii) leads the falling edge of said powering signal when the resonance frequency of said antenna circuit is greater than the frequency of said powering signal,
    the magnitude of the distance between the apex of said sine wave and the falling edge of said powering signal being the phase difference, said phase difference being related to the magnitude of the frequency difference between said resonance frequency and said powering signal;
    e) receiving by a zero crossing detector said correlation signal and conditioning this signal to be substantially a square wave for compatibility with digital logic circuitry;
    f) receiving by a phase shifter said powering signal, said phase shifter inducing a phase shift in said powering signal to correspond to the phase shift which is inherently induced in said zero crossing detector;
    g) receiving in a phase comparator the outputs of said zero crossing detector and said phase shifter, said phase comparator providing an output of a first logic level when the phase difference is less than a reference value and of a second logic level when the phase difference is greater than a reference value; and
    h) adjusting the resonant frequency of said resonant circuit by a control unit in response to the received output from said phase comparator.

11. A circuit arrangement for matching the resonant frequency of an antenna resonant circuit to the output frequency of a transmitter output stage comprising:

a) a transmitter output stage providing a powering signal;

b) an antenna resonant circuit for receiving said powering signal, said antenna resonant circuit having a predetermined resonant frequency and comprising a tuning circuit wherein said resonant frequency is dependent upon the value of said tuning circuit, said antenna resonant circuit having at its output a phase correlation signal, the phase of said phase correlation signal relative to said powering signal having a known relationship to the frequency difference between said resonant frequency and said powering signal; and c) a phase comparator for receiving said powering signal and said phase correlation signal and measuring the phase difference therebetween, said phase comparator further for controlling said tuning circuit to adjust the resonant frequency of said resonant circuit depending upon said phase difference.

12. The circuit arrangement of claim 11 wherein said resonant circuit further comprises an electrically coupled coil and capacitor, which are coupled in turn to said tuning circuit.

13. The circuit arrangement of claim 12 wherein said tuning circuit is a network of capacitors in parallel with said coil and said capacitor.

14. The circuit arrangement of claim 13 wherein the parallel resonant frequency of said coil and said capacitor is chosen to be less than a known minimum frequency of said powering signal and wherein the resonant frequency of said resonant circuit is adjusted by decreasing the capacity of the tuning circuit in steps until the resonant frequency of said resonant circuit is increased from its initial value to be approximately equal to the frequency of said powering signal.

15. The circuit arrangement of claim 13 wherein said network of capacitors is a set of binary-weighted tuning capacitors to be connected in parallel to said resonant circuit.

16. The circuit arrangement of claim 15 wherein said set of binary-weighted tuning capacitors is done by binary tuning steps such that the capacity of said tuning circuit is increased in approximately linear fashion.

17. The circuit arrangement of claim 15 wherein said set of binary-weighted tuning capacitors is done by successive approximation.

18. The circuit arrangement of claim 13 wherein said network of capacitors is a set of logarithmically-weighted tuning capacitors to be connected in parallel to said resonant circuit.

19. The circuit arrangement of claim 18 wherein said adjusting of said resonant frequency is effected by enabling or disabling of selected ones of said set of logarithmically-weighted tuning capacitors by adaptive methods whereby the size of the tuning step is proportional to the magnitude of the phase difference between said powering signal and said phase correlation signal.

20. A circuit arrangement for matching a resonant frequency of an antenna resonant circuit to an output frequency of a transmitter output stage comprising:

a) a transmitter output stage providing a powering signal;

b) an antenna resonant circuit for receiving said powering signal, said antenna resonant circuit having a predetermined resonant frequency and comprising a tuning circuit wherein said resonant frequency is dependent upon the value of said tuning circuit, said antenna resonant circuit having at its output a phase correlation signal, the phase of said phase correlation signal relative to said powering signal having a known relationship to a frequency difference between said resonant frequency and said powering signal; and c) a phase comparator for receiving said powering signal and said phase correlation signal and measuring the phase difference therebetween, said phase comparator providing a binary signal having a first polarity when said powering signal is of a greater amplitude than said phase correlation signal and a second polarity when said powering signal is of a lesser amplitude than said phase correlation signal;

d) a control unit for receiving said binary signal from said phase comparator and for controlling said tuning circuit to adjust the resonant frequency of said resonant circuit depending upon said phase difference between said phase correlation signal and said powering signal.

21. The circuit arrangement of claim 20 wherein said phase comparator is further Operable to output a binary signal having a first polarity when said powering signal is of a greater amplitude than said phase correlation signal and of a second polarity when said powering signal is of a lesser amplitude than said phase correlation signal and wherein a control circuit that receives said binary signal further is operable to adjust said resonant frequency in response thereto.

22. A method of matching a resonant frequency of an antenna resonant circuit to an output frequency of a transmitter output stage, the method comprising the steps of:

a) providing a powering signal from said transmitter output stage to said antenna resonant circuit, said antenna resonant circuit comprising a coil and a capacitor wherein the resonant frequency of said coil and capacitor is chosen to be outside known extreme of the frequency of said powering signal, said antenna resonant circuit further comprising a tuning circuit having a network of capacitors in parallel with said coil and said capacitor, said antenna resonant circuit providing a phase correlation signal at an output thereof;

b) receiving at said antenna resonant circuit said powering signal, the phase of said phase correlation signal relative to said powering signal having a known relationship to the frequency difference between said resonant frequency and said powering signal;

c) receiving in a phase comparator said powering signal and said phase correlation signal; and d) adjusting the resonant frequency of said resonant circuit in response to a received output of said phase comparator by changing the capacity of the tuning circuit in steps until the resonant frequency of said resonant circuit is approximately equal to the frequency of said powering signal.

23. The method of claim 22 wherein said step of adjusting the resonant frequency of said resonant circuit is performed in binary tuning steps such that the capacity of said tuning circuit is modified in an approximately linear fashion.

24. The method of claim 22 wherein said step of adjusting the resonant frequency of said resonant circuit is performed by successive approximation.

25. The method of claim 22 wherein said step of adjusting the resonant frequency of said resonant frequency is performed in logarithmic tuning steps such that the capacity of said tuning circuit is modified in an approximately logarithmic fashion.

26. The method of claim 25 wherein said step of adjusting said resonant frequency is effected by enabling or disabling selected ones of said set of logarithmically-weighted tuning capacitors by adaptive methods whereby the size of the tuning step is proportional to the magnitude of the phase difference between said powering signal and said phase correlation signal.

27. A circuit arrangement for matching a resonant frequency of an antenna resonant circuit to an output frequency of a transmitter output stage comprising:

a) a transmitter output stage providing a powering signal;

b) an antenna resonant circuit for receiving said powering signal, said antenna resonant circuit comprising an electrically coupled coil and capacitor, wherein the resonant frequency of said electrically coupled coil and capacitor is chosen to be outside known extreme of the frequency of said powering signal, said antenna resonant circuit further comprising a tuning circuit comprising a network of capacitors electrically coupled to said resonant circuit wherein said tuning circuit is operable to modify said resonant frequency, said antenna resonant circuit further providing at its output a phase correlation signal, the phase of said phase correlation signal having a known relationship to the frequency difference between said resonant frequency and said powering signal; and c) a phase comparator for receiving said powering signal and said phase correlation signal and measuring the phase difference therebetween, said phase comparator further for controlling said tuning circuit to adjust the resonant frequency of said resonant circuit in response to the comparison between the powering signal and the phase correlation signal until the resonant frequency of said resonant frequency is approximately equal to the frequency of said powering signal.

28. The circuit of claim 27 wherein said network of capacitors is binarily weighted and wherein the resonant frequency of said resonant circuit is adjusted in binary tuning steps such that the capacity of said tuning circuit is modified in an approximately linear fashion.

29. The circuit of claim 27 wherein said resonant circuit is adjusted by successive approximation.

30. The circuit of claim 27 wherein said network of capacitors is logarithmically weighted and wherein the resonant frequency of said resonant circuit is adjusted in logarithmic tuning steps such that the capacity of said tuning circuit is modified in an approximately logarithmic fashion.

31. A circuit arrangement for matching a resonant frequency of an antenna resonant circuit to an output frequency of a transmitter output stage comprising:

a) a transmitter output stage providing a powering signal;

b) a modulator for modulating said powering signal with information to be transmitted to a transponder, said modulation creating a modulated powering signal wherein said modulated powering signal comprises discontinuities;

c) an antenna resonant circuit for receiving said modulated powering signal, said antenna resonant circuit having a predetermined resonant frequency and comprising a tuning circuit wherein said resonant frequency is dependent upon the value of said tuning circuit, said antenna resonant circuit having at its output a phase correlation signal, the phase of said phase correlation signal relative to said powering signal having a known relationship to the frequency difference between said resonant frequency and said modulated powering signal; and d) a phase comparator for receiving said modulated powering signal and said phase correlation signal and measuring the phase difference therebetween, said phase comparator further for controlling said tuning circuit to adjust the resonant frequency of said resonant circuit depending upon said phase difference.

32. The circuit arrangement of claim 31 wherein the discontinuities formed on said modulated powering signal are from pulse width modulation of said powering signal.

33. The circuit arrangement of claim 31 wherein the discontinuities formed on said modulated powering signal are from pulse pause modulation of said powering signal.

* * * * *